United States Patent [19]
Ohishi et al.

[11] Patent Number: 5,184,055
[45] Date of Patent: Feb. 2, 1993

[54] DEVICE FOR POSITIONING CONTROL

[75] Inventors: Shinji Ohishi, Yokohama; Kotaro Akutsu, Machida; Toshikazu Sakai, Yokohama, all of Japan

[73] Assignee: Canon Kabushiki Kaisha, Tokyo, Japan

[21] Appl. No.: 592,982

[22] Filed: Oct. 4, 1990

[30] Foreign Application Priority Data

Oct. 6, 1989 [JP] Japan ................................. 1-260276
Jun. 14, 1990 [JP] Japan ................................. 2-153894

[51] Int. Cl.$^5$ .............................................. G05B 5/01
[52] U.S. Cl. ................................. 318/615; 318/561; 318/609; 318/610; 318/611; 318/616; 318/617; 318/618; 360/78.12; 369/53
[58] Field of Search ............... 318/615, 561, 616–618, 318/609–611, 640; 360/78.12; 346/76 L; 369/53

[56] References Cited

U.S. PATENT DOCUMENTS

| | | | |
|---|---|---|---|
| 4,456,860 | 6/1984 | Cann et al. | 318/561 |
| 4,464,030 | 8/1984 | Gale et al. | 346/76 L X |
| 4,654,571 | 3/1987 | Hinds | 318/640 X |
| 4,692,915 | 9/1987 | Moriya et al. | 369/53 |
| 4,742,286 | 3/1988 | Phillips | 318/640 |
| 4,810,941 | 3/1989 | Ohishi et al. | 318/314 |
| 4,888,536 | 12/1989 | Sakai et al. | 318/592 |
| 4,967,293 | 10/1990 | Aruga et al. | 360/78.12 |

*Primary Examiner*—William M. Shoop, Jr.
*Assistant Examiner*—Karen Masih
*Attorney, Agent, or Firm*—Fitzpatrick, Cella, Harper & Scinto

[57] ABSTRACT

A device for positioning control includes a movable stage; an acceleration sensor disposed on the movable table; a feedback loop for controlling movement of the movable table; and an acceleration feedback loop provided in relation to an acceleration signal from the acceleration sensor, wherein the acceleration feedback loop is provided as an internal loop to the feedback loop.

14 Claims, 13 Drawing Sheets

DEVICE FOR POSITIONING CONTROL

FIELD OF THE INVENTION AND RELATED ART

This invention relates to a device for positioning control, adapted to execute high-speed and high-precision control of positioning with the use of a servo circuit. More particularly, the invention is concerned with a device for positioning control, for an X-Y stage used in a semiconductor device manufacturing exposure apparatus.

Referring first to the block diagram of FIG. 13 showing an exemplary positioning control device of known type, the control device includes a PID control circuit 1 for executing proportioning (P), integration (I) and differentiation (D) to a positional error "e", for stabilization of the control system. Denoted at 2 is a digital-to-analog converter (hereinafter "D/A converter"), and denoted at 3 is a controlled system (object to be controlled) which includes a motor driver, a motor and an associated mechanism. FIG. 14 shows an exemplary positioning table mechanism of known type, which is a part of the controlled system 3 In FIG. 14, denoted at 4 is a top plate; at 5 are yaw guides; and 6 are pad mounts; at 7 are air pads; at 8 are linear motor coils; at 9 is a permanent magnet; and at 10 is a measuring mirror. This positioning table mechanism corresponds to a direct drive stage with a linear motor (8, 9) using static pressure air pads 7. The position of the top plate 4 which can be moved by the linear motor (8, 9) can be measured through a laser distance gauge (not shown) by using the mirror 10, and the measured position is fed back to the PID control circuit 1, Referring to the block diagram of FIG. 18 showing an exemplary y-axis speed control device of known type for an X-Y stage, denoted at 21 is a PID control and adjustment circuit, and denoted at 36 is a controlled system including a motor driver, a linear motor and an associated mechanism. FIG. 19 shows an exemplary X-Y stage mechanism of known type, which is a part of the controlled system 36. In FIG. 19, denoted at 23 is an X stage; at 24 is a Y stage for guiding the movement of the X stage 23; at 25 are guides for guiding the movement of the Y stage 24; at 26 are air pads; at 27 is a linear motor; at 28 is a measuring mirror. This X-Y stage mechanism corresponds to a direct drive stage with a linear motor (27) using static pressure air pads (26). The position of the stage 23 can be measured through a laser distance gauge (not shown) by using the mirror 28, and the measured position is fed back to the control and adjustment circuit 21.

SUMMARY OF THE INVENTION

In the positioning control device such as shown in FIG. 13, it is desirable that the control band is heightened as much as possible from the viewpoint of anti-disturbance and high speed response.

However, in almost all the cases the positioning mechanism of the controlled system 3 has a resonance mode (peak). Naturally, the stage device shown in FIG. 4 is not an exception, and it has a characteristic such as shown in FIG. 15 wherein the modeling has been conducted up to the first-order resonance mode. In conventional PID control systems, such a resonance mode of the mechanism leads to a narrowed control band, and usually it is about $f_0/5-f_0/3$, where $f_0$ is the resonance frequency of the mechanism which is about 380 Hz in the FIG. 15 example.

FIG. 16 shows measured values of a closed loop Bode diagram on an occasion when, to the controlled system 3, optimization of the PID gain of the control circuit 1 of FIG. 13 has been effected. The upper part shows the gain characteristic, and the lower part shows the phase characteristic It is seen from the drawing that, in the example of FIG. 13, at about 380 Hz, a phase delay of 180 degrees occurs and, due to the resonance peak, the control system becomes unstable. Thus, in this example, the control frequency $f_1$ is about 110 Hz, and it is not easy to broaden the control band any more. The control frequency $f_1$ in this example is 1/3.5 of the resonance peak value (380 Hz).

As a solution for such a problem, there is a well-known method in which a notch filter (band stop filter) having a characteristic such as shown in FIG. 17 is used to decrease the resonance peak value. However, since the phase delays in the low frequency region, the system easily becomes unstable and, thus, a significant effect is not expected.

If the control circuit 1 is provided by software, it may be considered to attain band broadening in accordance with the technique of the modern control theory, such as prediction of the state by an observer and feedback of the state. However, it needs accurate modeling of the controlled system 3 as well as high-speed software processing. Therefore, practically, it is difficult to do so.

As described, a conventional fine positioning table based on PID control involves a disadvantage of limited control band due to the resonance mode (peak) of the mechanism It is accordingly an object of the present invention to provide a positioning control device by which band broadening can be attained even with a PID control system.

In accordance with an aspect of the present invention, to achieve this object, an acceleration sensor is mounted in the neighborhood of the measuring mirror, and an acceleration feedback loop is added to the PID position control loop as a minor loop. With this arrangement, it is possible to reduce the resonance peak, whereby band broadening of the control system is attained.

Referring back to FIG. 19, also in such an X-Y stage mechanism as shown in the drawing, it is necessary to heighten the control frequency as much as possible in the viewpoint of high speed response.

By way of example, FIG. 20 shows the result of simulation of the y-axis speed control open loop characteristic having a resonance peak at 200 Hz. This resonance peak is based on the rolling mode of the stage mechanism. The control frequency is 85 Hz and the gain margin is 0 (zero) dB. FIG. 21 shows the result of simulation of the y-axis speed control open loop frequency characteristic, of the characteristic shown in FIG. 20. Since the closed loop characteristics have a peak of about 16 dB at 200 Hz, the control system becomes highly vibratory which adversely affects the positioning time as the stage 24 is moved stepwise. For this reason, an actual control system should necessarily be arranged to have a decreased proportional gain, and practically the positioning control has to be effected at a control frequency lower than 85 Hz.

Thus, the stage positioning control of known type such as shown in FIG. 18, involves the following inconveniences:

(1) Due the resonance peak of the mechanism, the control band is narrowed, resulting in prolonged stage positioning time.

(2) Since the system easily vibrates at the resonance frequency, the attitude precision of the stage decreases.

It is accordingly a second object of the present invention to attain broadening of the control band of the positioning control device with a simple structure, to thereby shorten the positioning response time and, on the other hand, to reduce the resonance peak of the mechanism to thereby increase the attitude precision of the stage.

In accordance with an aspect of the present invention, to achieve such an object, an acceleration sensor so disposed such that the resonance peak of the x-axis rolling made to be detected can be detected with good sensitivity. By using a filter, the frequency band in question is picked up, and its acceleration as well as the first derivative (jerk) of the acceleration are fed back to the inside of the speed control loop as an interior loop. With this arrangement, it is possible to reduce the resonance peak and also to increase the control frequency (to broaden the control band).

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
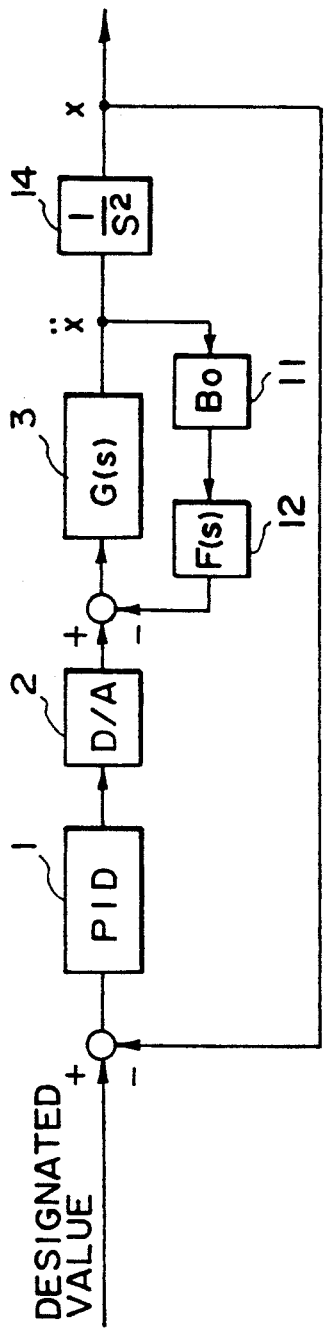
FIG. 1 is a block diagram of a control system of a positioning control device according to an embodiment of the present invention.
Figure 2:
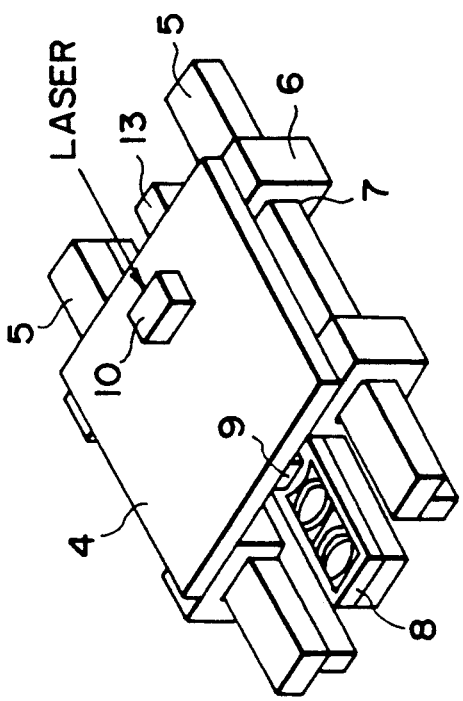
FIG. 2 is a perspective view of a positioning table mechanism, usable in this embodiment.

Referring to the block diagram of FIG. 1, there is shown a table positioning control device according to an embodiment of the present invention. FIG. 2 shows a positioning table mechanism used in this embodiment, having an acceleration sensor mounted thereto. In FIGS. 1 and 2, denoted at 1 is a PID control circuit for execution of proportioning (P), integration (I) and differentiation (D). To this PID circuit 1, a signal (positioning error signal) is inputted which signal represents the difference (positional error) between (i) a target position (designated value) for a table 4 of a controlled system 3, as outputted from a central processing unit (CPU) not shown, and (ii) the current position of the table 4 as measured through a laser interferometer distance gauge (not shown) by use of a measuring mirror 10 provided on the table 4. To this positional error signal, the PID control circuit 1 then executes proportioning (P), integration (I) and differentiation (D) and, by using the results of these computations, it prepares a control signal (digital signal). Denoted at 2 is a D/A converter for executing digital-to-analog conversion of the signal supplied from the PID control circuit 1. Denoted at 3 is the controlled system (object to be controlled) to which a difference between the output signal of the D/A converter 2 and a signal from a filter circuit 12, is applied. In this embodiment, the controlled system 3 includes the table 4, a motor for moving the table 4, a motor driver for controlling drive of the motor in accordance with the received differential signal, and a table mechanism such as shown in FIG. 2.

In FIG. 2, denoted at 5 are guide rails for guiding the movement of the table 4; at 6 are mounts for mounting static pressure air pads 7 to the table 4; at 8 are linear motor coils; at 9 is a permanent magnet fixedly provided on the table 4 so as to be opposed to the linear motor coils 8; and at 13 is an acceleration sensor mounted to the table 4 at a position adjacent to the mirror 10. The table 4 is floatingly supported on the guide rails 5 by means of the static pressure air pads 7. The linear motor coils 8 and the permanent magnet 9 cooperate to provide a linear motor for direct drive of the table 4 along the guide rails 5.

Referring back to FIG. 1, denoted at 11 is a gain adjusting circuit for adjusting the acceleration feedback gain; at 12 is a filter circuit for band limiting to the acceleration feedback loop; and at 14 is an integration circuit for integrating twice, with time, an acceleration signal $\ddot{x}$ from the acceleration sensor 13 provided in the controlled system 3, to thereby convert it into a position signal x. The current position signal from the integration circuit 14 or the current position signal from the laser interferometer distance gauge (not shown) using the mirror 10, is fed back to the PID control circuit 1 for moving the table 4 to its target position (destination). Also, the acceleration signal $\ddot{x}$ from the acceleration sensor 13 in the controlled system 3 goes through the gain adjusting circuit 11 and the filter circuit 12 in this order, and is fed back into the controlled system 3 (motor driver). This acceleration feedback loop for the controlled system 3 is provided as an interior loop to the servo loop of the PID control circuit 1.

Figure 3:
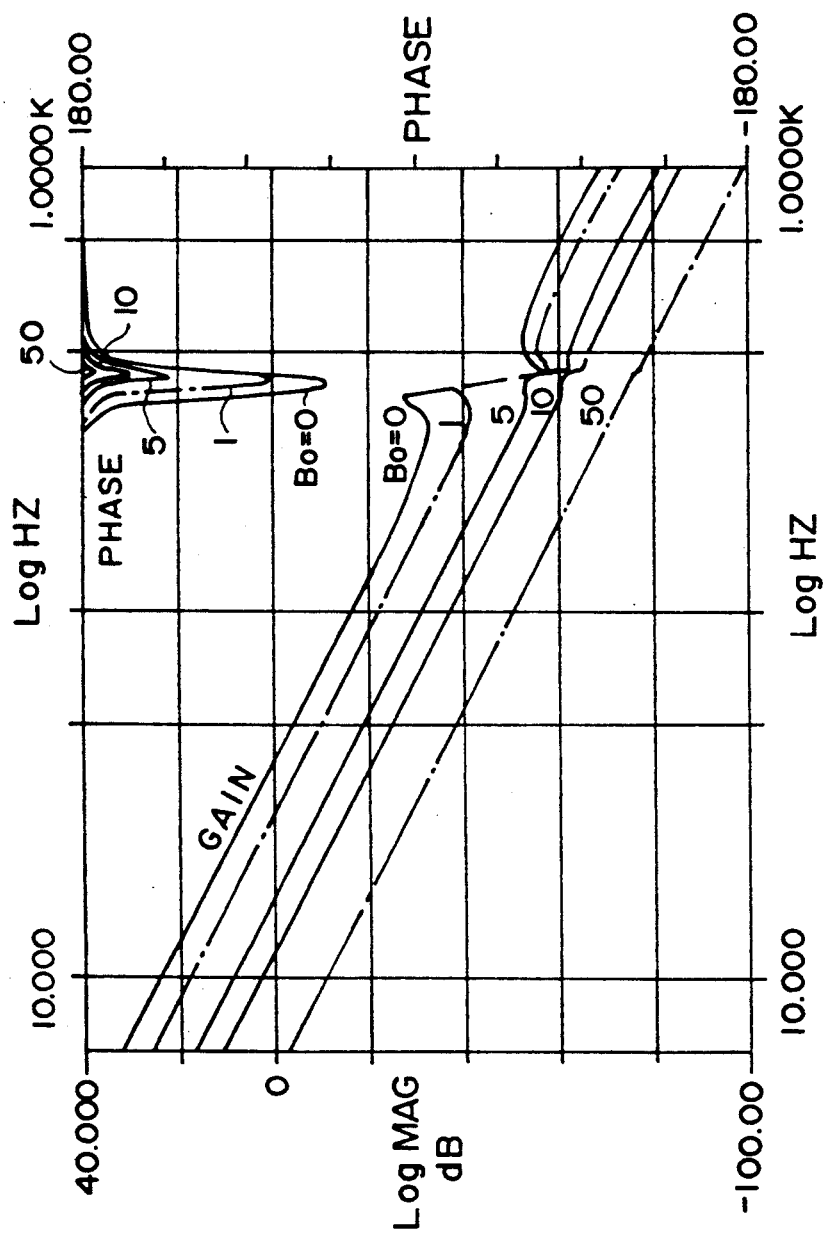
FIG. 3 is a Bode diagram showing the result of simulation of the acceleration feedback.

FIG. 3 shows the result of simulation. It is seen in the drawing that, in this embodiment, if the feedback gain Bo with respect to the acceleration signal $\ddot{x}$ is increased by the gain adjusting circuit 11, then the resonance peak decreases, and also, the phase delay reduces. Illustrated in FIG. 3 are the state of resonance peak and the state of phase delay in a case when the feedback gain Bo is Bo=0 (no acceleration feedback) and in cases of Bo=1, Bo=5, Bo=10 and Bo=50, respectively. As described, if the acceleration feedback gain Bo increases, the resonance peak decreases and the phase delay reduces. This is because the acceleration feedback serves to reduce the resonance. Although increasing the acceleration feedback gain Bo results in lowering the servo gain curve, it can be easily corrected by readjustment of the servo gain in the PID control circuit 1.

Figure 4:
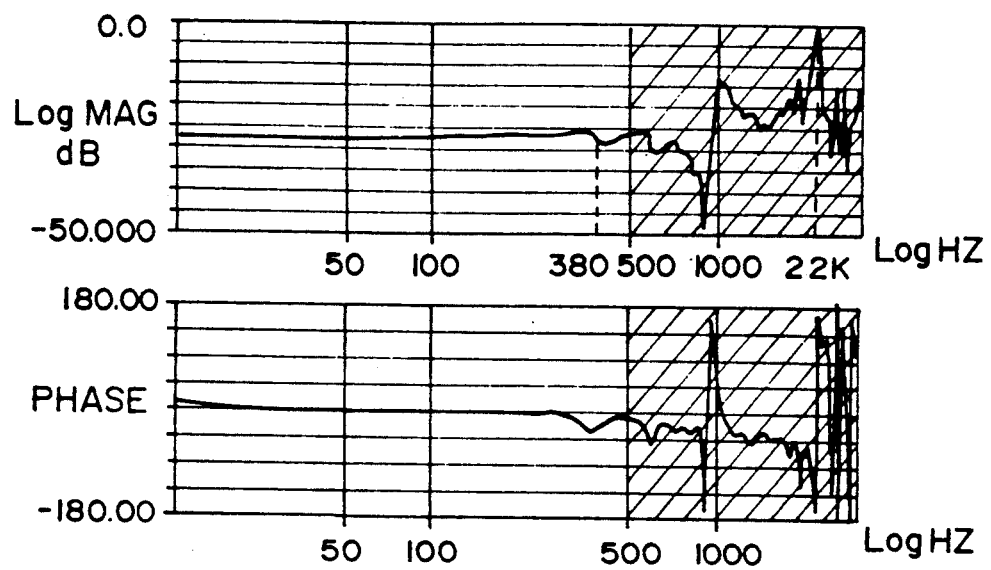
FIG. 4 is a Bode diagram based on measured values of the acceleration output of the controlled system.

Actually, the controlled system 3 has many complicated resonance peaks in a high order range. FIG. 4 is a Bode diagram of measured values of the acceleration output $\ddot{x}$ from the acceleration sensor 13, on an occasion when an acceleration feedback loop is added with the filter circuit 12 and when the table 4 is moved through a predetermined distance by the stage mechanism of FIG. 2. It is seen from the drawing that, if the acceleration feedback loop is added without use of the filter circuit 12, a high-order resonance peak having delayed phase causes oscillation. According to experiments made with regard to the present embodiment without the filter circuit 12, it has been confirmed that the control system oscillates at 2.2 KHz (highest peak).

Next, description will be made of the manner of determining the specification of the filter circuit 12. What is to be eliminated is the lowest-order resonance peak of the mechanism (380 Hz in the stage of the present embodiment), and it is desirable to measure such a peak with a sensitivity as high as possible. Also, for stabilization of the acceleration feedback loop it is desirable to eliminate (reduce) such a resonance peak of the mechanism which is at the side higher than this. In consideration thereof, a second-order low pass filter is used as the filter circuit 12 and, by setting its cutoff frequency (resonance peak frequency of the filter) and the resonance peak frequency of the mechanism, to be eliminated, to be equal to each other, it is possible to solve both of these problems.

Figure 5:
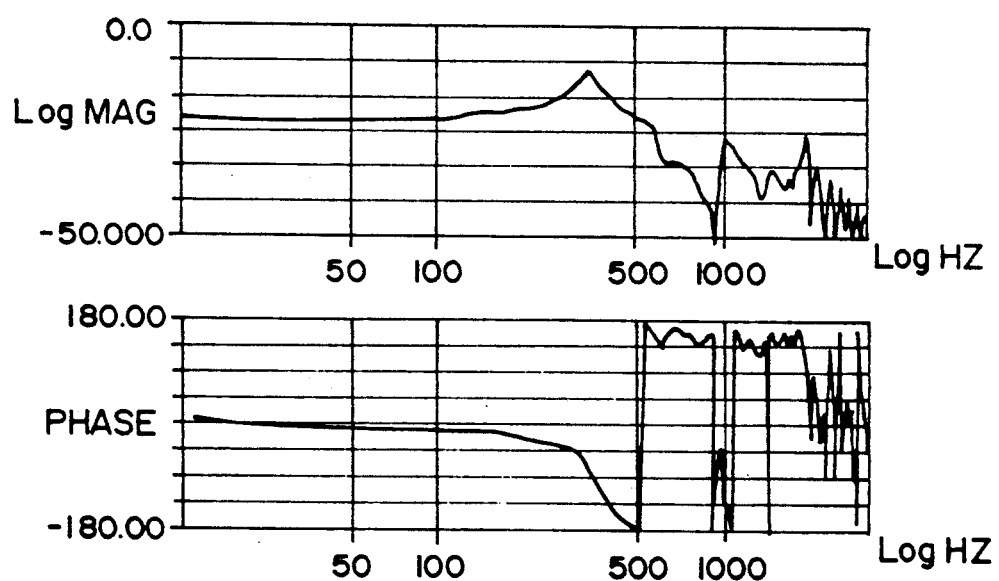
FIG. 5 is a Bode diagram based on measured values (through secondary low pass) of the acceleration output of the controlled system.

FIG. 5 is a Bode diagram of measured values of the acceleration output $\ddot{x}$ from the acceleration sensor 13 with a second-order low-pass filter 12 (fc=380 Hz and $\zeta=0.1$) being added. As expected, the resonance peak at 380 Hz wa enlarged while the higher frequency side was reduced. As described, it has been confirmed that, with the addition of the second-order low pass filter 12 into the acceleration feedback loop, the higher frequency side is stabilized.

Figure 6:
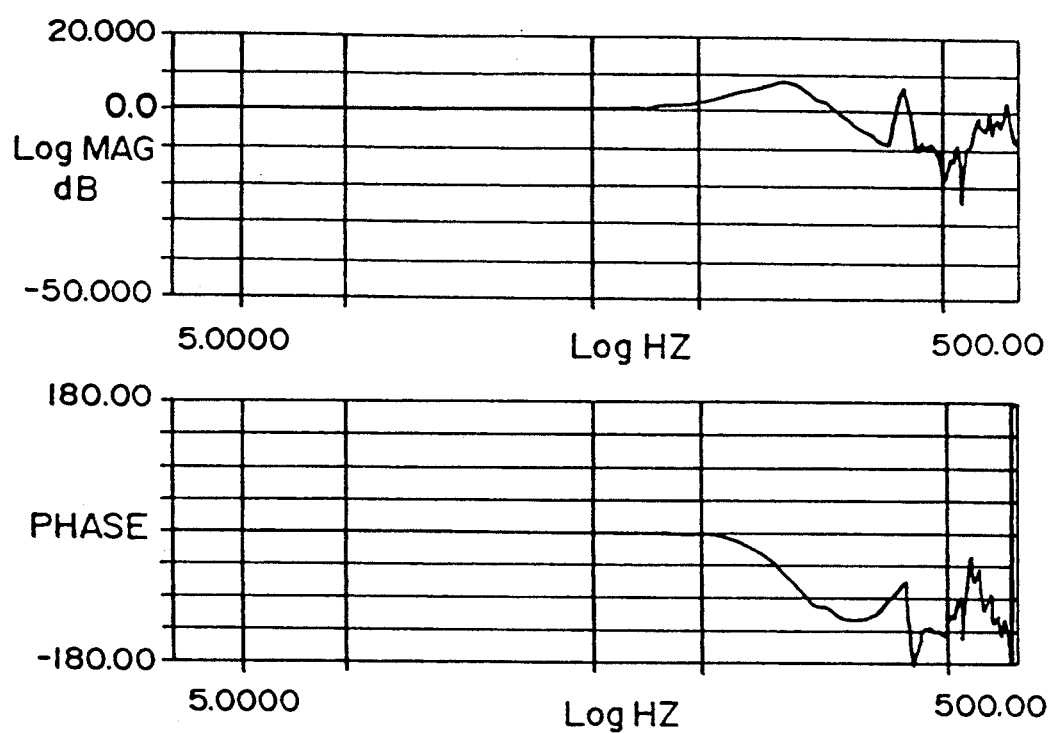
FIG. 6 is a closed loop Bode diagram of the control system of the FIG. 1 embodiment.

Subsequently, the acceleration feedback gain Bo and the PID gain were determined on the basis of simulation and experiments, and their optimization was conducted. Finally, a closed loop Bode diagram as shown in FIG. 6 was obtained. Even at the resonance peak of about 380 Hz, having caused inconveniences in the prior art, the phase precedes −180 degrees, and the system is stabilized. Also, the control frequency 190 Hz is attained. Thus, large band broadening is possible as compared with the conventional PID control.

In the present invention, an acceleration feedback loop is applied to the controlled system 3 so as to change (improve) the characteristic of the controlled system 3. Therefore, the control algorithm is not limited to the PID control, and substantially the same effect is obtainable with any other algorithm (e.g. I-PD control). Also, while in the preceding embodiment a second-order low pass filter is used for stabilization of the acceleration feedback loop, a higher-order low-pass filter or any other filter may be used.

There may be a possibility that, due to the band broadening, the system oscillates when the table 4 is moved at a high speed. In consideration thereof, a switch for turning on and off the acceleration feedback loop may be provided to changeover the system between motion and stoppage.

In accordance with the foregoing embodiments, as described hereinbefore, an acceleration sensor is mounted to a fine positioning table to detect the acceleration thereof, while an acceleration feedback loop is added into the position feedback loop as an interior loop. By this, it is possible to attain band broadening of the control system. Also, since only a simple structure for acceleration feedback using an acceleration sensor is necessary, the invention can be easily applied to an existing control system.

Figure 7:
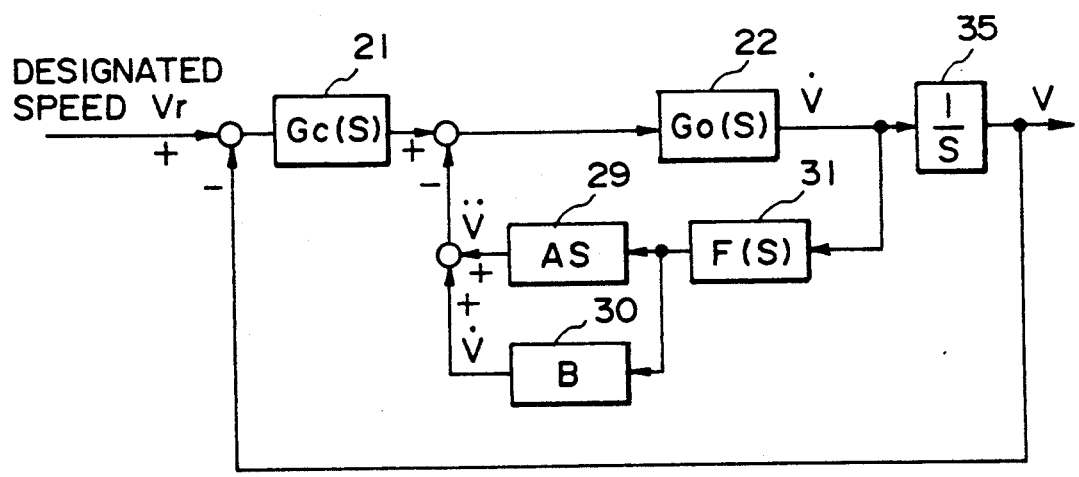
FIG. 7 is a block diagram of a y-axis speed control system of a positioning control device according to another embodiment of the present invention.
Figure 8:
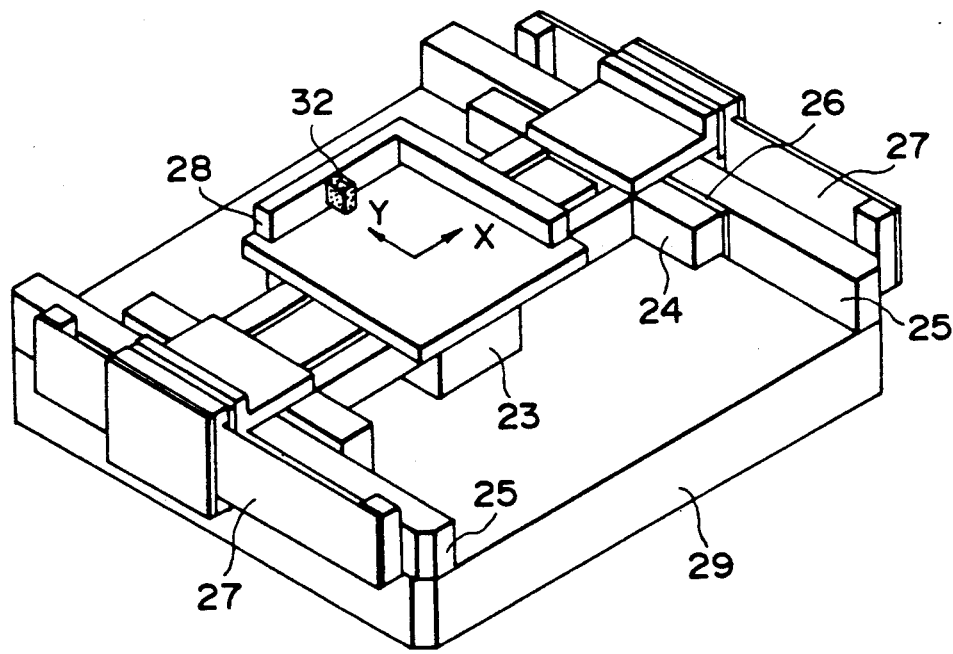
FIG. 8 is a perspective view of an X-Y stage mechanism, usable with the FIG. 7 embodiment.

FIG. 7 is a y-axis speed control block diagram of a fine X-Y stage in a positioning device according to another embodiment of the present invention. In FIG. 7, denoted at 21 is a control circuit. To this control circuit 21, a signal (differential signal) is inputted, which differential signal represents a difference between (i) the designated speed Vr signaled from a central processing unit (CPU), not shown, and (ii) a current moving speed in the y-axis direction of an X stage 23 (FIG. 8) being moved by a Y stage 24, as measured through a laser interferometer distance gauge (not shown) by using a measuring mirror 28. The control circuit 21 then executes proportioning (P) processing to the received signal and, by using the result, it prepares a control signal. Denoted at 22 is a controlled system (object to be controlled) to which a differential signal between the output of the control circuit 21 and a signal of an acceleration feedback loop, to be described later, is applied. The controlled system 22 includes a linear motor 27 for moving the Y-stage 24 in the y-axis direction, and a motor driver (not shown) for driving the linear motor 27 on the basis of the received differential signal. Also, the controlled system 22 includes an X-Y stage mechanism such as shown in FIG. 8. In FIG. 8, denoted at 23 is an X stage which is floatingly supported by static pressure air pads (not shown) with respect to a surface plate 29 and the Y stage 24 and which is movable in the x-axis direction by means of a linear motor mounted to the Y stage 24. Denoted at 25 are guide rails for guiding the movement of the Y stage 24 in the y-axis direction. Denoted at 26 are static pressure air pads for floatingly supporting the Y stage 24 on the guide rails 25. The Y stage 24 is moved through a direct drive of the linear motor 27 in the y-axis direction. Denoted at 28 is a measuring mirror which is provided on the X stage 23 and cooperates with a laser interferometer distance gauge (not shown) for measurement of the current position or the current speed of the X stage 23 with respect to the x-axis and y-axis directions. Denoted at 32 is an acceleration sensor which is mounted to the X stage 23 at a position in the neighborhood of a portion to be used for the measurement of the position and speed of the mirror 28 in the y-axis direction, namely, at the position far away from the center of the X stage 23 with respect to the y-axis direction, so as to ensure high-sensitivity detection of the resonance mode (peak) of the rolling with respect to the x-axis direction. Also, the mounting position of this acceleration sensor 32 is determined so as to minimize the possibility that vibration other than that at 200 Hz is sensed by the acceleration sensor 32.

Referring back to FIG. 7, denoted at 29 is a jerk gain adjusting circuit for adjusting a jerk gain A with respect to a jerk feedback signal which is the first derivative (s) of an acceleration output v̇ from the acceleration sensor 32, passed through the filter circuit 31. Denoted at 30 is an acceleration gain adjusting circuit for adjusting an acceleration gain B with respect to the acceleration feedback signal corresponding to the acceleration output v̇ from the acceleration sensor 32, passed through the filter circuit 31. The feedback signals from these circuits 29 and 30 are added to each other, and the sum is fed back to the controlled system 22. The filter circuit 31 is provided to extract the frequency band to be extracted, of the minor feedback loop as constituted by these circuits. Integration circuit 35 is provided to integrate the acceleration output v̇ from the controlled system 22 to determine the current speed V. The thus determined current speed V or the current speed V having been determined through the laser interferometer distance gauge by using the mirror 28, is fed back to the control circuit 21 for the speed servo control.

Figure 9:
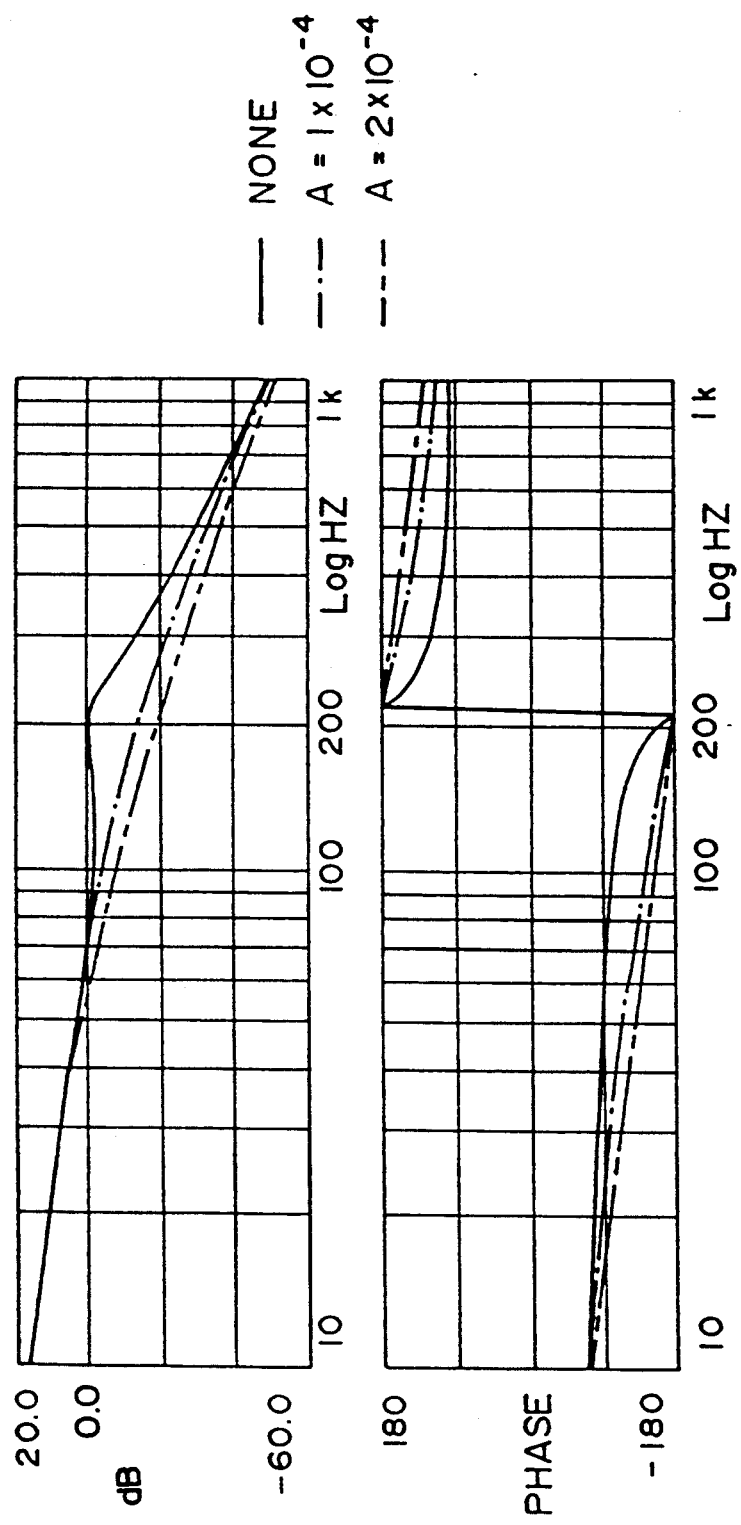
FIG. 9 is a graph showing the y-axis open loop characteristic, with jerk feedback only.

FIG. 9 shows the result of simulation of the y-axis speed control open loop characteristic on an occasion when, in the structure described above, only the jerk feedback signal is fed back to the controlled system 22. It is clear from the drawing that, by increasing the jerk gain A, the peak at 200 Hz can be lowered. However, the phase crossover (frequency whereat the phase delays by 180 degrees) is unchanged.

Figure 10:
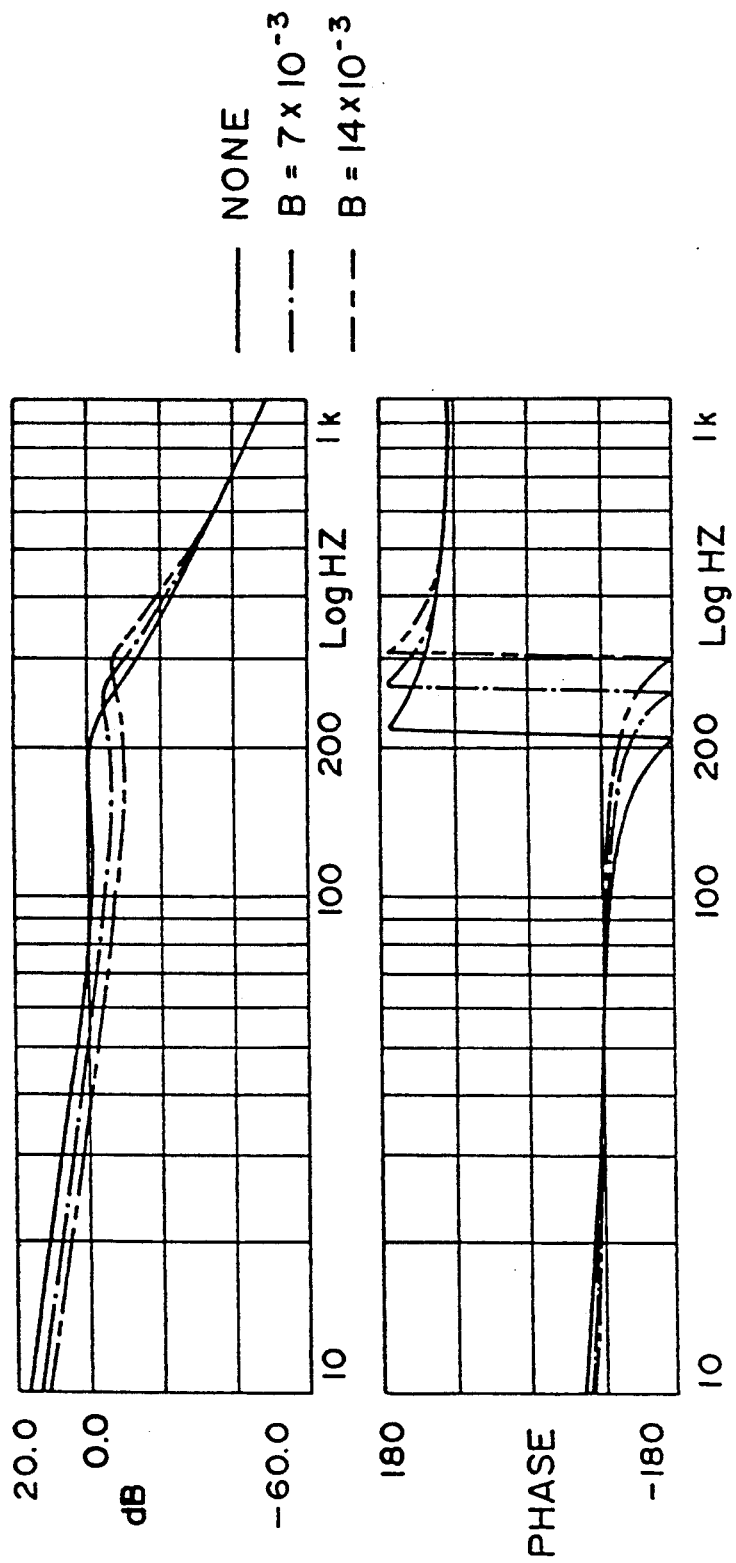
FIG. 10 is a graph showing the y-axis open loop characteristic, with acceleration feedback only.

FIG. 10 shows the results of simulation of the y-axis speed control open loop characteristic on an occasion when only the acceleration feedback signal is fed back. It is seen from the drawing that, by increasing the acceleration gain B, the phase crossover shifts toward the higher frequency region. However, the magnitude of the peak is unchanged.

Figure 11:
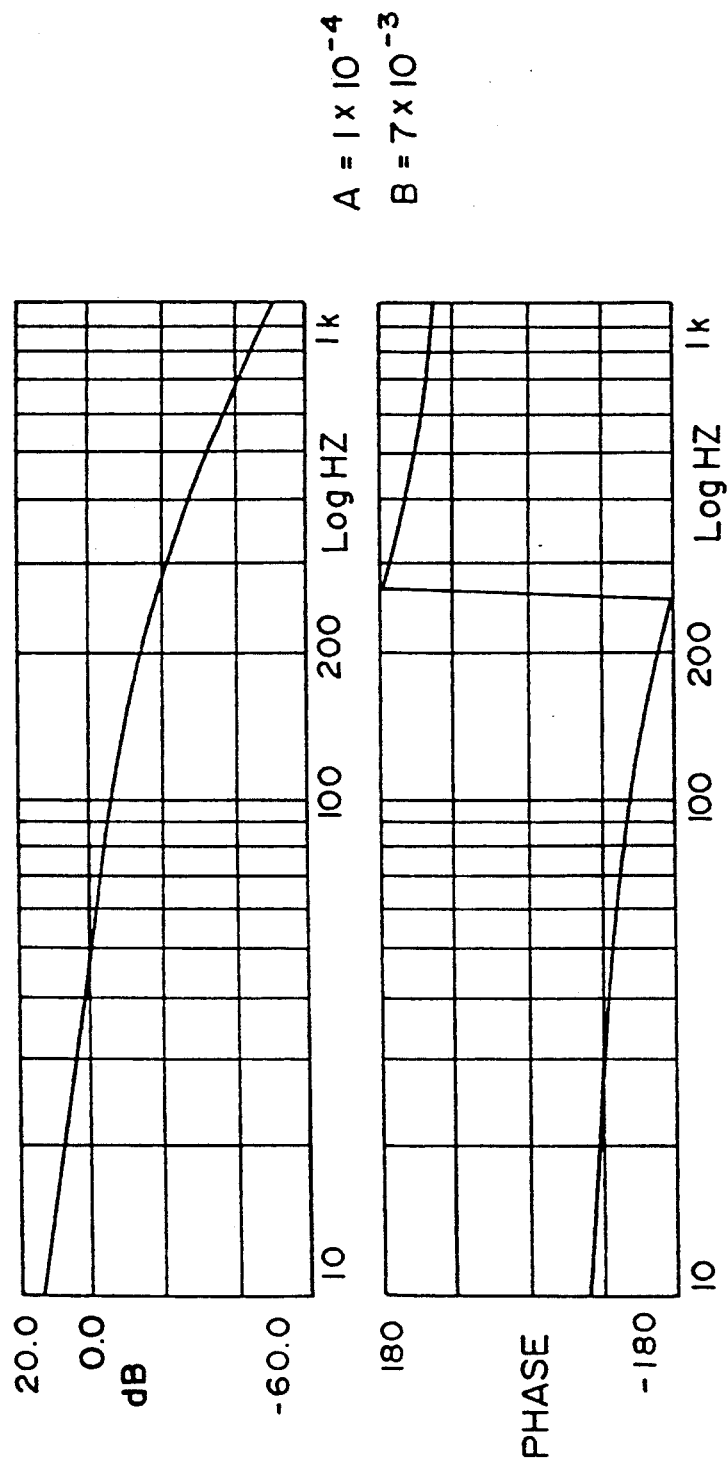
FIG. 11 is a graph showing the y-axis open loop characteristic of the control device of the FIG. 7 embodiment.
Figure 12:
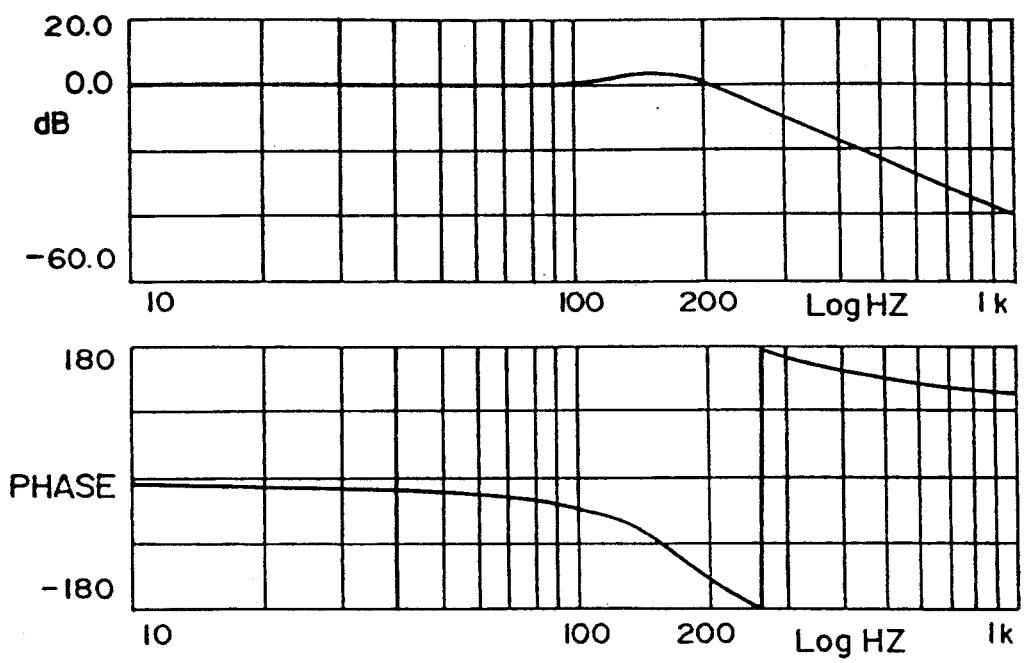
FIG. 12 is a graph showing the y-axis closed loop characteristics of the control device of the FIG. 7 embodiment.
Figure 13:
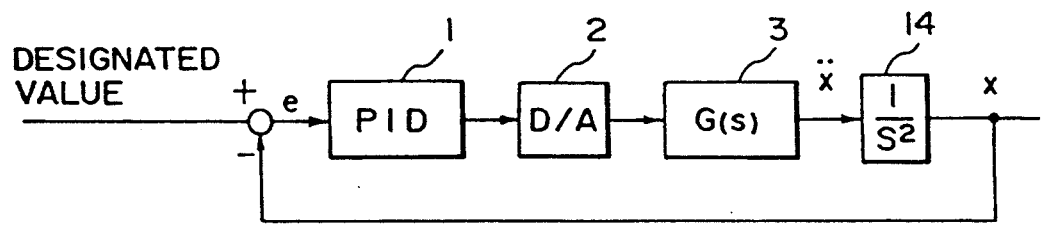
FIG. 13 is a block diagram of a control system in a positioning control device of known type.
Figure 14:
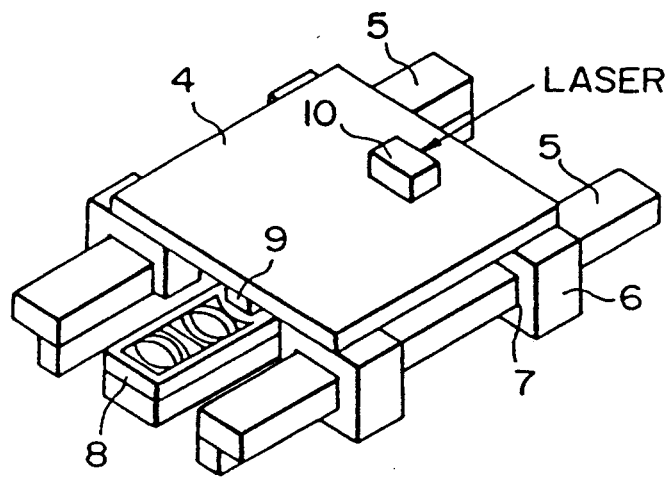
FIG. 14 is a perspective view of a positioning table mechanism of the device of FIG. 13.
Figure 15:
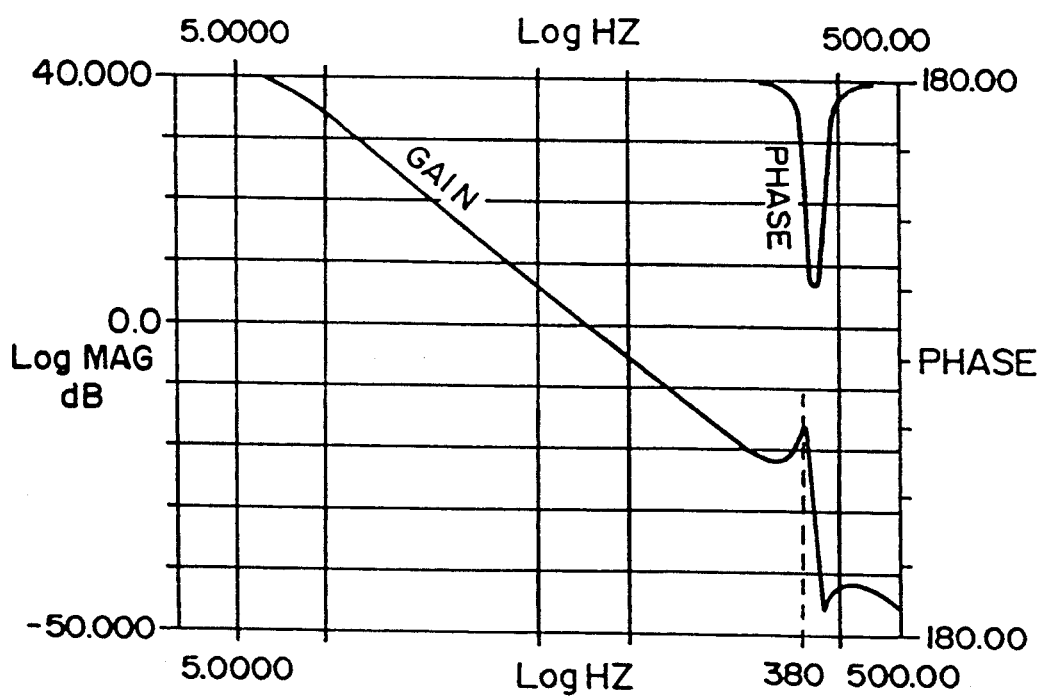
FIG. 15 is a Bode diagram of a model of a controlled system.
Figure 16:
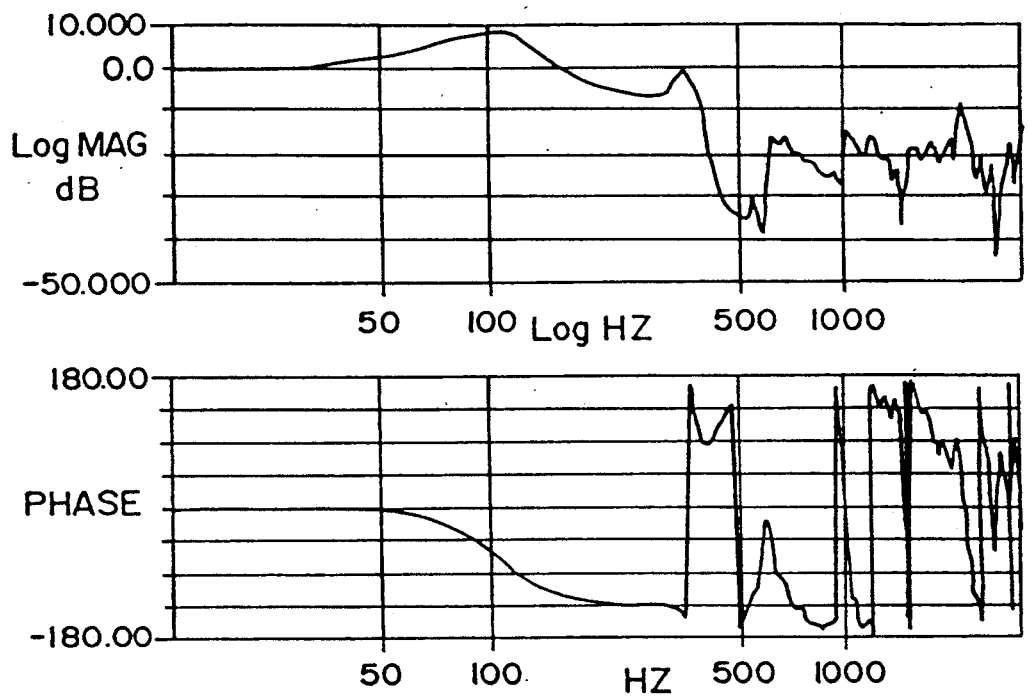
FIG. 16 is a closed loop Bode diagram based on the control system of the device of FIG. 13.
Figure 17:
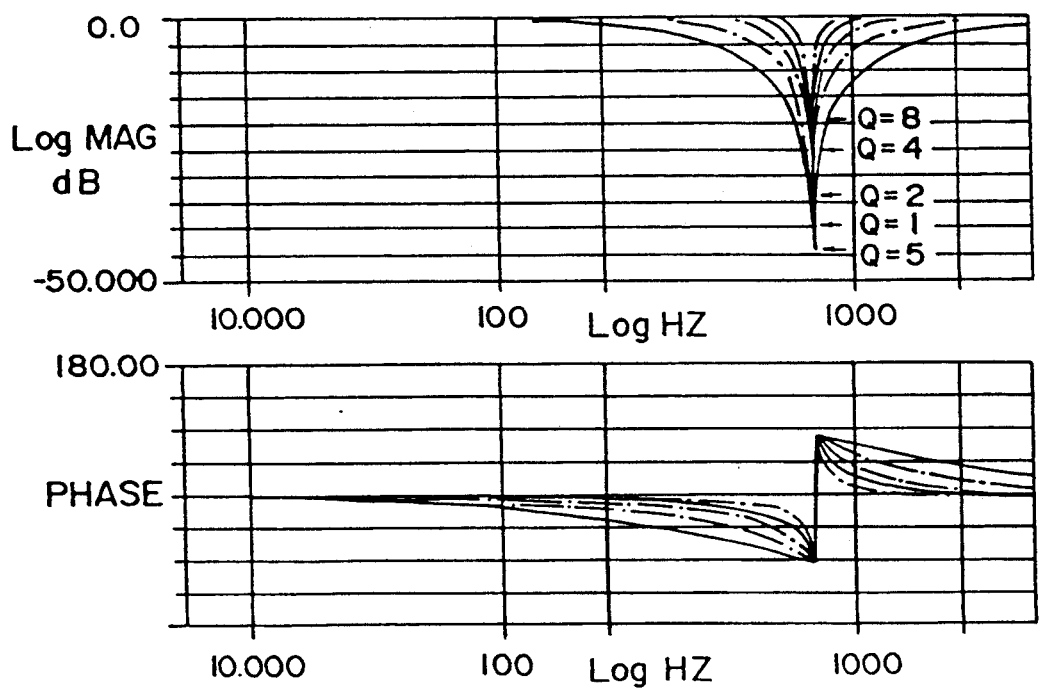
FIG. 17 is a Bode diagram of a notch filter
Figure 18:
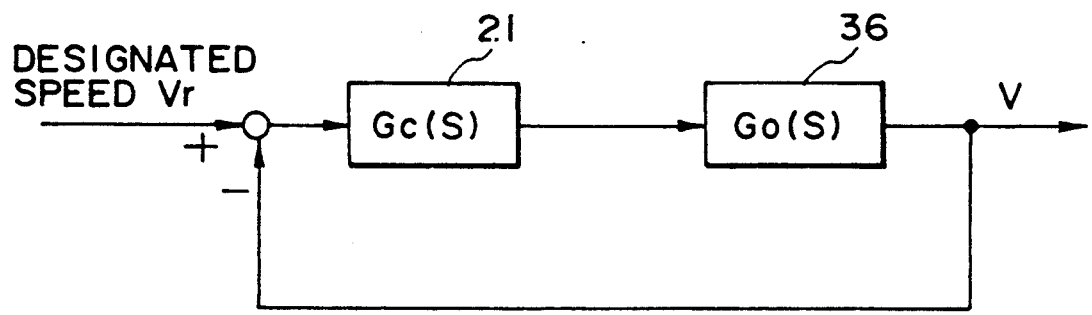
FIG. 18 is a block diagram of a y-axis speed control system in a positioning device of known type.
Figure 19:
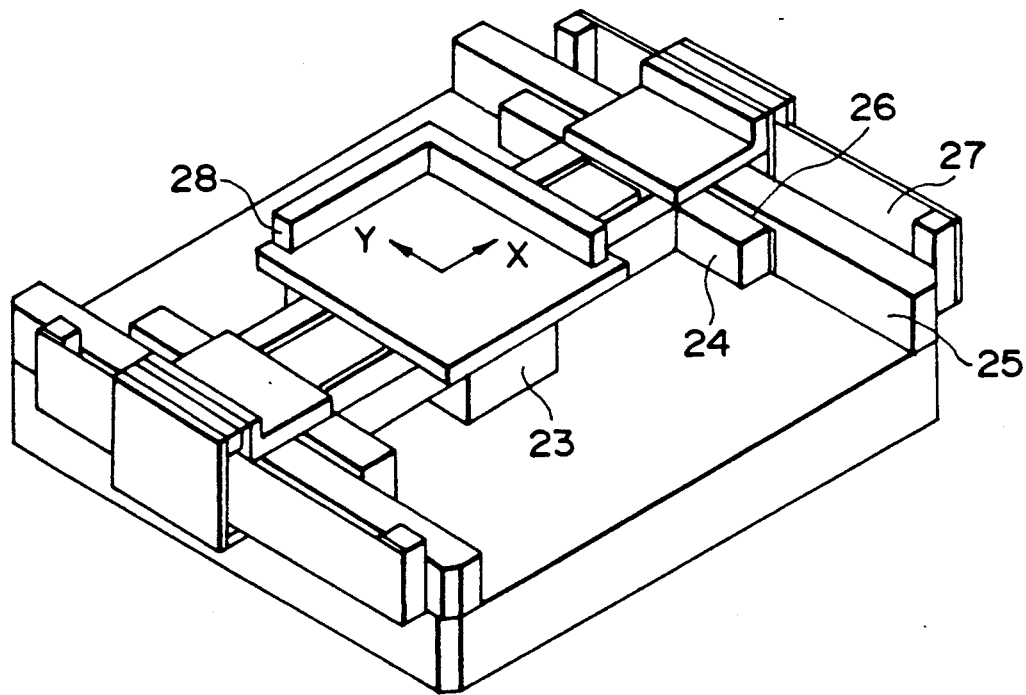
FIG. 19 is a perspective view of an X-Y stage mechanism used with the device of FIG. 18.
Figure 20:
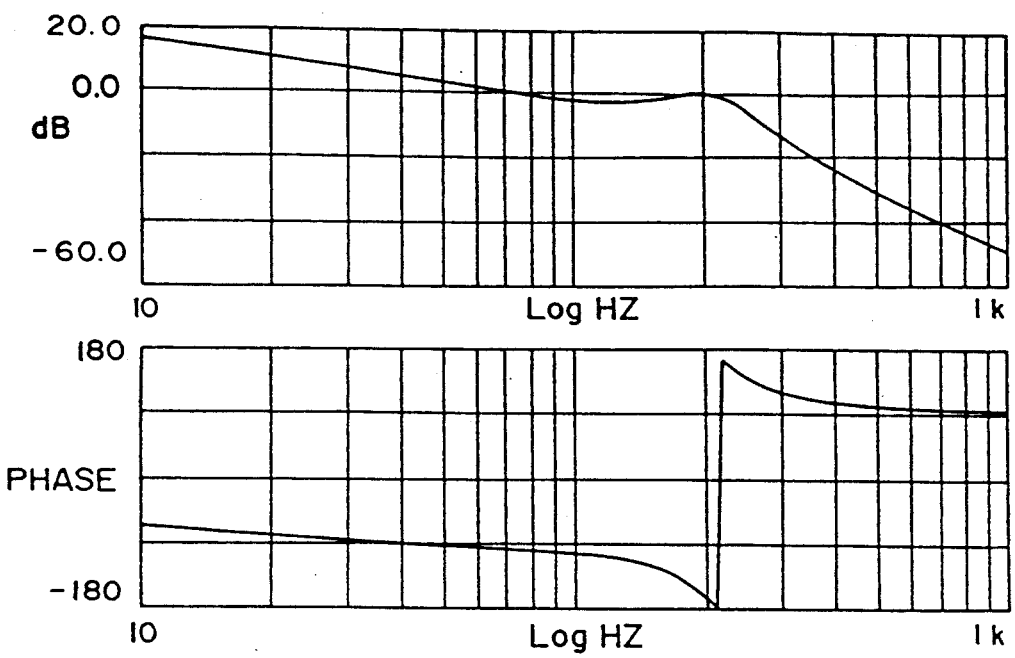
FIG. 20 is a graph showing the y-axis open loop characteristic of the device of FIG. 18.
Figure 21:
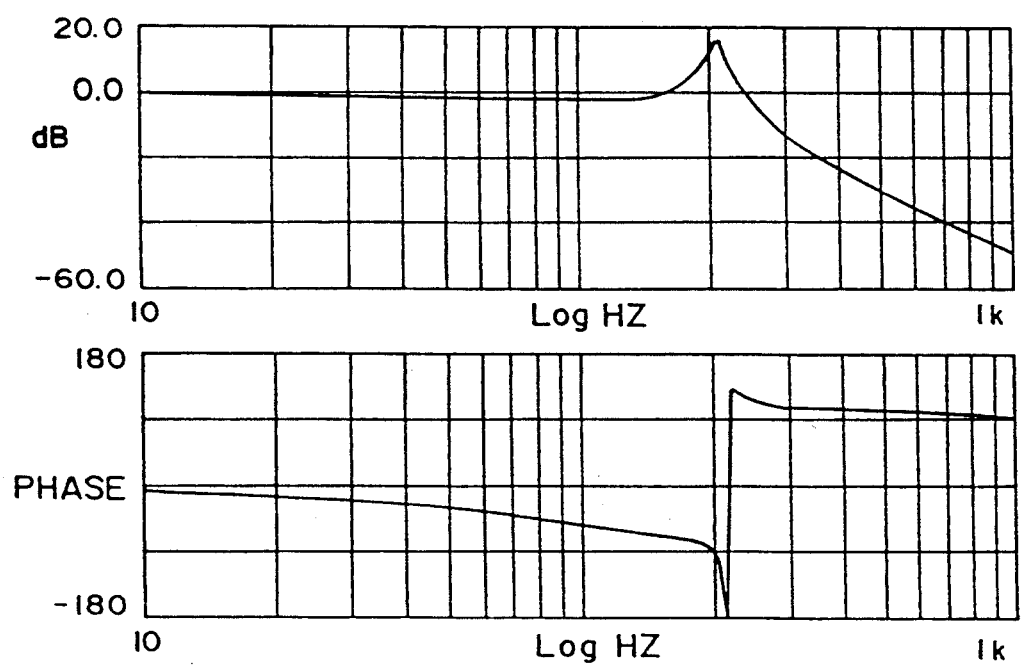
FIG. 21 is a graph showing the y-axis closed loop characteristic of the device of FIG. 18.

It is seen from the foregoing that the vibration peak can be decreased and the phase crossover can be increased, by the feedback of the jerk signal and the acceleration signal. FIG. 11 shows the result of simulation of the open loop characteristic on an occasion when the jerk gain A and the acceleration gain B are adjusted suitably and the jerk signal and the acceleration signal are fed back. Also, FIG. 12 shows the result of simulation of the closed loop characteristic on an occasion when the proportioning gain is increased by the control and adjusting circuit 21. Here, as seen from FIG. 12, the obtained characteristic is such that the control frequency is 150 Hz and, thus, the control band is broadened considerably, and vibration of the system is suppressed sufficiently. When a practical control system is considered, the controlled system 3 has many peaks in the high frequency region. Since the jerk feedback has a possibility of further increasing these peaks, there is a possibility that the stability of the control system is damaged. Thus, if the jerk feedback actually results in an increase of the peak in the higher frequency region, it is necessary to avoid this. Also, because of a possibility that the acceleration sensor 32 senses low frequency disturbance vibration (e.g. vibration of the surface plate), it is preferable to cut the low frequency portion of the acceleration output. Thus, the provision of such a filter that extracts only the aimed frequency region of the acceleration output, is preferable. In the present embodiment, by the special disposition of the acceleration sensor 32 and by use of a bandpass filter 31 comprising a combination of a first-order high-pass filter and a third-order Butterworth-type low-pass filter, only the frequency (200 Hz) of the object mode is extracted.

In the present embodiment, the vibratory characteristic of the controlled system 22 is improved by applying feedback loop of acceleration and jerk. Therefore, substantially the same effect is obtainable even if the control and adjustment circuit 21 is based on a control and adjustment method such as PI or PID, for example.

Also, while in the preceding embodiment the x-axis rolling mode of the mechanism is selected as the object, the described control is also effective to any other mode, such as yawing of the mechanism, for example.

Further, while in the preceding embodiment the extracting filter comprises a combination of a first order high-pass filter and a third-order Butterworth type low-pass filter, clearly a higher order filter may be used.

In accordance with this embodiment of the present invention, as described hereinbefore, an acceleration sensor is mounted to a high-precision X-Y stage to detect the acceleration thereof, and only the object frequency band is extracted by a bandpass filter. By adding a feedback loop of acceleration and jerk into the control loop as a minor loop, it is possible to increase the control frequency and, thus, to broaden the control band. Therefore, it is possible to reduce the positioning response time in the stepping. Further, since it is possible to suppress the amplitude of vibration at the resonance frequency, the attitude precision of the stage can be improved. Further, since the structure is very simple, the invention can be easily applied to an existing system.

While the invention has been described with reference to the structures disclosed herein, it is not confined to the details set forth and this application is intended to cover such modifications or changes as may come within the purposes of the improvements or the scope of the following claims.

What is claimed is:

1. A device for positioning control, comprising:
   a movable table;
   an acceleration sensor disposed on said movable table for producing an acceleration signal;
   a feedback loop for providing a control signal to control movement of said movable table; and
   an acceleration feedback loop for receiving the acceleration signal produced by said acceleration sensor, wherein said acceleration feedback loop is provided as an internal loop to said feedback loop, said acceleration feedback loop comprising a filter circuit comprising a second-order low-pass filter.

2. A device according to claim 1, wherein said low pass filter has a cut-off frequency which is equal to a resonance frequency of a mechanism which includes said movable table.

3. A device for positioning control, comprising:
   a base member;
   a guide member provided on said base member;
   a Y stage movable on said base member in a y-axis direction, along said guide member;
   an X stage movable in an x-axis direction relative to said Y stage;

a mirror disposed on said X stage, for measuring position of the Y stage;

a feedback loop for controlling movement of said Y stage on the basis of an amount of movement, measured by said mirror; and an acceleration sensor disposed on said X stage, at a position adjacent to said mirror.

4. A device according to claim 3, wherein said acceleration sensor is provided at a position remote from the center of said X stage with respect to the y-axis direction, for detecting modes with high-sensitivity.

5. A device according to claim 4, wherein the mode detected by said acceleration sensor includes a rolling mode of said x stage in the x-axis direction.

6. A device according to claim 3, wherein said acceleration sensor produces an output, and further comprising a bandpass filter for extracting only the frequency band of an object mode, out of the output produced by said acceleration sensor.

7. A device according to claim 6, further comprising an internal loop for feeding back to said feedback loop an acceleration signal extracted by said filer as well as a jerk signal corresponding to a first derivative of the acceleration signal.

8. A positioning control method comprising the steps of:

providing a major feedback loop for providing signals to control movement of a movable table and a minor feedback loop for providing signals to control vibration of the movable table;

controlling the movement of the movable table in accordance with the signals provided by the major feedback loop;

detecting acceleration of the movement of the movable table through an acceleration sensor provided on the movable table, and producing an acceleration signal from the acceleration sensor; and extracting from the acceleration signal, in the minor feedback loop, a signal having a frequency in a particular region that is used in controlling the vibration of the movable table.

9. A method according to claim 8, wherein the minor feedback loop includes a low-pass filter having a cut-off frequency which is substantially the same as a resonance frequency of a mechanical portion that includes the movable table.

10. A method according to claim 8, further comprising detecting by the minor feedback loop, out of the acceleration signal and by using a band-pass filter, only a resonance frequency band of a portion of the movable table.

11. A method according to claim 10, further comprising generating a jerk signal by once differentiating an acceleration signal extracted by the band-pass filter and using the jerk signal by the minor feedback loop in controlling the vibration of the movable table.

12. A positioning control device comprising:

a movable table mechanism comprising a movable table;

measuring means for measuring position of said movable table and for producing a measurement signal which changes with the position of said movable table;

a major feedback loop for controlling movement of said movable table on the basis of the measurement signal produced by said measuring means;

an acceleration sensor provided on said movable table for producing an acceleration signal; and a minor feedback loop for controlling vibration of said movable table on the basis of the acceleration signal produced by said acceleration sensor, said minor feedback loop comprising a low-pass filter having a cut-off frequency which is substantially the same as a resonance frequency of said movable table mechanism.

13. A device according to claim 12, wherein said minor feedback loop further comprises a gain adjusting circuit for adjusting gain relative to the acceleration signal.

14. A positioning control device comprising:

a movable table mechanism comprising a movable table;

measuring means for measuring position of said movable table and for producing a measurement signal which changes with the position of said movable table;

a major feedback loop for controlling movement of said movable table on the basis of the measurement signal produced by said measuring means;

an acceleration sensor provided on said movable table for producing an acceleration signal; and a minor feedback loop for controlling vibration of said movable table on the basis of the acceleration signal produced by said acceleration sensor, said minor feedback loop comprising a band-pass filer for extracting a resonance frequency of said movable table mechanism as well as a jerk signal obtained by differentiating the acceleration signal passing through said band-pass filter.

* * * * *

UNITED STATES PATENT AND TRADEMARK OFFICE
CERTIFICATE OF CORRECTION

PATENT NO. : 5,184,055

DATED : February 2, 1993

INVENTOR(S) : Shinji Ohishi, et al.

It is certified that error appears in the above-identified patent and that said Letters Patent is hereby corrected as shown below:

COLUMN 1

Line 24, "3" should read --3.--; and
    Line 35, "1," should read --1.--.

COLUMN 2

Line 8, "characteristic" should read --characteristic.--; and
    Line 33, "mechanism" should read --mechanism.--.

COLUMN 3

Line 1, "Due" should read --Due to--; and
    Line 68, "filter" should read --filter.--.

UNITED STATES PATENT AND TRADEMARK OFFICE
CERTIFICATE OF CORRECTION

PATENT NO. : 5,184,055

DATED : February 2, 1993

INVENTOR(S) : Shinji Ohishi, et al.

It is certified that error appears in the above-identified patent and that said Letters Patent is hereby corrected as shown below:

COLUMN 9

Line 14, "x stage" should read --X stage--; and
    Line 23, "filer" should read --filter--.

COLUMN 10

Line 46, "filer" shoudl read --filter--.

Signed and Sealed this

Eleventh Day of January, 1994

Attest:

BRUCE LEHMAN

*Attesting Officer*   *Commissioner of Patents and Trademarks*